(12) United States Patent
Harrington et al.

(10) Patent No.: US 6,410,402 B1
(45) Date of Patent: Jun. 25, 2002

(54) METHOD OF PROVIDING VARIANT FILLS IN SEMICONDUCTOR TRENCHES

(75) Inventors: Jay Harrington, Wappingers Falls; Liang-Kai Han, Fishkill, both of NY (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 09/680,380

(22) Filed: Oct. 5, 2000

(51) Int. Cl.⁷ .............................................. H01L 21/76
(52) U.S. Cl. ........................ 438/424; 438/427; 438/700
(58) Field of Search ................................ 438/424, 700, 438/427, 241

(56) References Cited

U.S. PATENT DOCUMENTS 6,294,423 B1 * 9/2001 Malik et al. ................ 438/241

* cited by examiner

*Primary Examiner*—Caridad Everhart
(74) *Attorney, Agent, or Firm*—Ira Blecker; Cantor Colburn LLP

(57) ABSTRACT

Disclosed is a method of providing variant fills in a semiconductor substrate having a plurality of trenches by providing a semiconductor substrate with a first set of trenches and a second set of trenches, filling all the trenches with a first fill material, masking the second set of trenches in a manner effective in resisting an etching of said first fill material, etching the first fill material in the first set of trenches to a depth effective in permitting the first set of trenches to be plugged, plugging the first set of trenches with a material resistant to an etching of the first fill material, etching the first fill material from the second set of trenches; and then filling the second set of trenches with a second fill material. The process may be generalized to more than two fill materials.

13 Claims, 5 Drawing Sheets

Figure 1
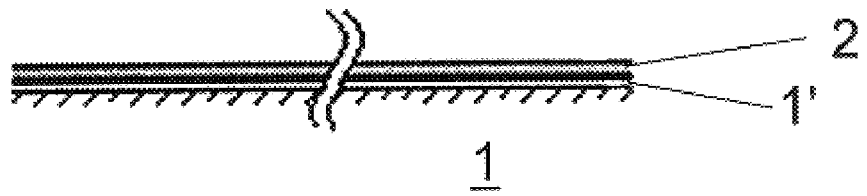
Figure 2
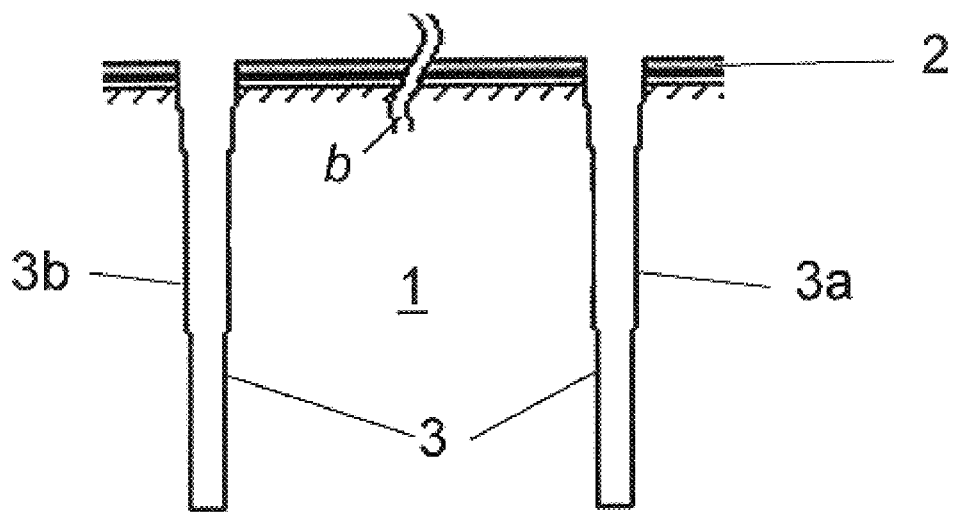
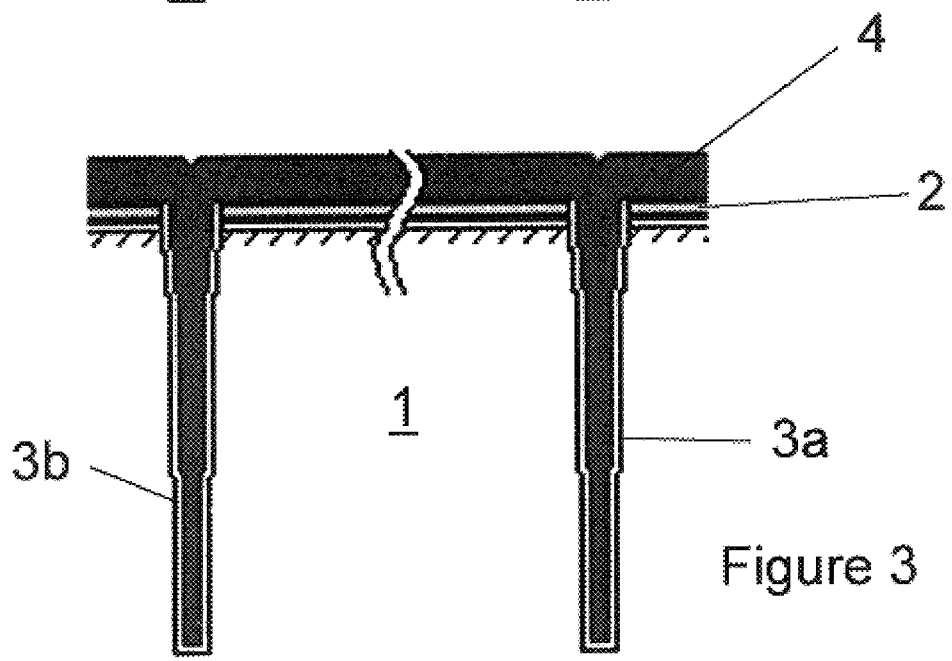
Figure 3

METHOD OF PROVIDING VARIANT FILLS IN SEMICONDUCTOR TRENCHES

FIELD OF THE INVENTION

This invention relates to filling trenches in semiconductor manufacture.

BACKGROUND OF THE INVENTION

It is known in the semiconductor wafer manufacturing art to create depressions or trenches and then fill them with a semiconductor material. However, for any one layer being worked on at a time, the manufacturer is confronted with an "all or nothing" choice of using only one kind of fill material for all the open trenches on the semiconductor substrate. What is needed is a method to permit different fill materials to be used for different open trenches.

SUMMARY OF THE INVENTION

Described herein is a method of providing variant fills in a semiconductor substrate having a plurality of trenches wherein it is desired to fill a first set of the trenches with a first fill material and a second set of the trenches with a second fill material. The method begins by first filling all the trenches with the first fill material. The second set of trenches are then masked in a manner effective in resisting an etching operation on the first fill material. An etching operation is then effected which only etches the fill in the unmasked first set of trenches. This first fill material is not etched out completely, but only enough to leave room for a plug at the top of the trench. The first set of trenches is then plugged with a material resistant to an etching of the first fill material, so that now the first fill material in the plugged trenches is protected. Now, another etching operation is carried out (after the mask on the second set of trenches has been stripped off) so as to completely remove all of the first fill material from the second set of trenches. With the first set of trenches plugged, it is a straightforward matter to then fill in the newly emptied second set of trenches with a second fill material as desired.

BRIEF DESCRIPTION OF THE DRAWINGS

FIG. 1 shows a typical semiconductor substrate.

FIG. 2 shows a typical semiconductor substrate with trenches.

FIG. 3 shows the step of filling all the trenches with a first fill.

DETAILED DESCRIPTION OF THE INVENTION

Figure 4:
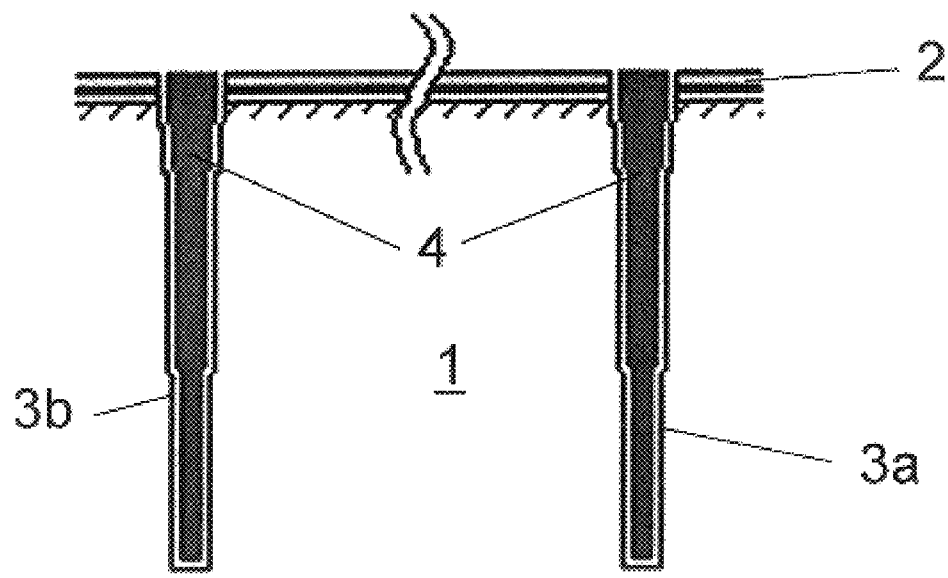
FIG. 4 shows the results of a planarization.

Referring to FIG. 1, there is depicted a typical starting semiconductor substrate 1 generally comprising a silicon wafer with a $SiO_2$ film 1', and having a silicon nitride film 2 deposited thereon.

FIG. 2 shows the semiconductor substrate 1 after the etching of a plurality of trenches 3 by lithographic means well known in the semiconductor art. A first set of trenches 3a are those that manufacturer desires to fill with a first type of fill material and a second set of trenches 3b are those that the manufacturer desires to fill with a second type of fill material. The break lines b are simply to illustrate that the trenches need not be immediately adjacent to one another in the substrate 1.

FIG. 3 depicts the start of the variant fill process disclosed herein. Upon the exposed semiconductor substrate 1 is laid down a first fill, in this example a layer of thermal silicon oxide and undoped conformal polysilicon 4 that fills all the open trenches 3. This is generally achieved by first growing a thin thermal oxide layer of about 100 angstroms thickness followed by a conformal layer of polycrystalline silicon of about 1200 angstroms thick. For the purposes of this specification, we use this $SiO_2$/polycrystalline silicon layer by way of example, as the first fill 4 for illustrative purposes only. The manufacturer will of course decide what material he wishes to fill the first set of trenches 3a with.

Note that "conformal" is used in a manner known in the art to indicate layers that are deposited with about the same thickness on vertical surfaces as on horizontal ones, such that the amount of material needed to fill a trench is only about one-half the width of the trench, not the entire depth. Conformal deposits therefore tend to fill trenches in from the sides, rather than from the bottom up.

Referring to FIG. 4, the first fill 4 is planarized down to the underlying surface, thereby leaving only the trenches 3 filled with the first fill material 4.

Figure 5:
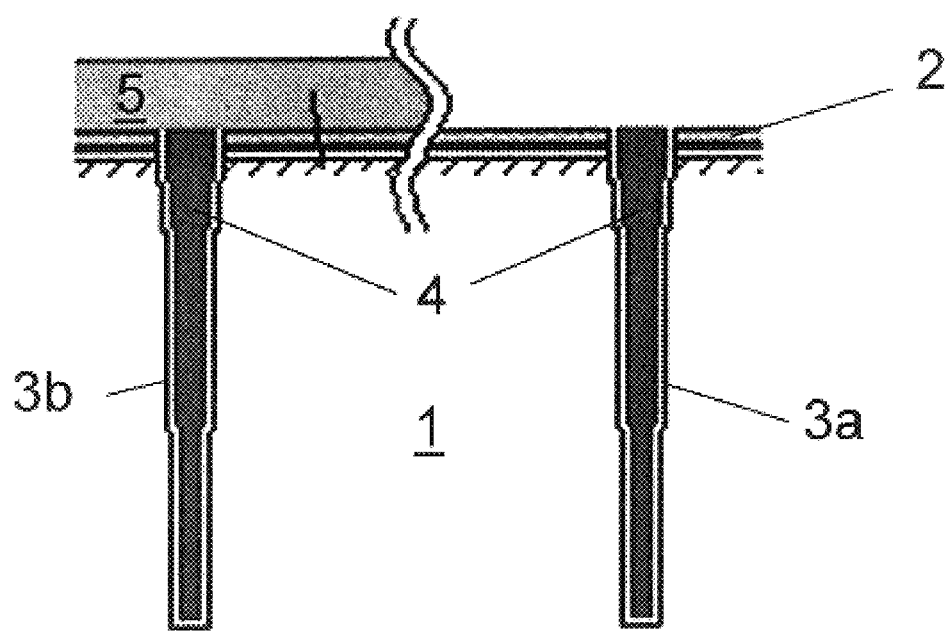
FIG. 5 shows the selective laying down of a resist mask.

Referring to FIG. 5, a resist mask 5 is laid down to cover the second set of trenches 3b, thereby leaving the first set of trenches 3a exposed.

Figure 6:
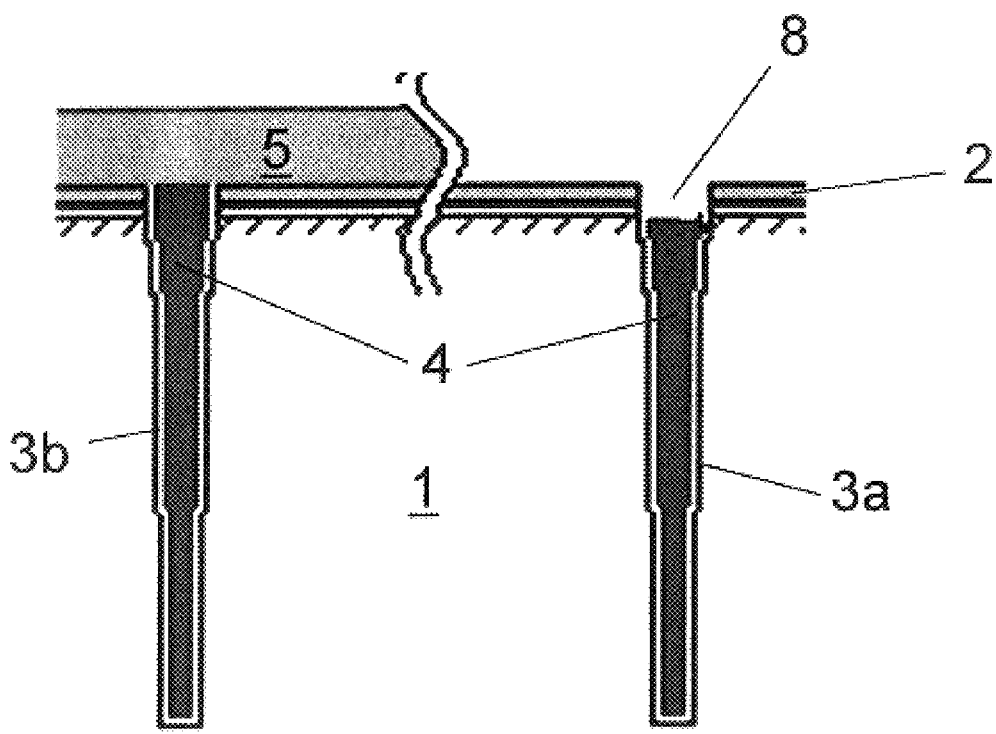
FIG. 6 shows the results of an etching.

Referring to FIG. 6, the exposed first set of trenches 3a are etched with a reagent suited to the first fill material 4 until the first fill 4 is lowered beneath the wafer surface to a sufficient depth for plugging. Generally, the depth of the resulting plug cavity 8 will be no less than about half the width of the trench when using conformal plug materials. This is because conformal materials fill in from the sides, therefore we want the depth of the plug cavity 8 to be deep enough to ensure the plug material fills in from the sides faster than from the bottom.

Figure 7:
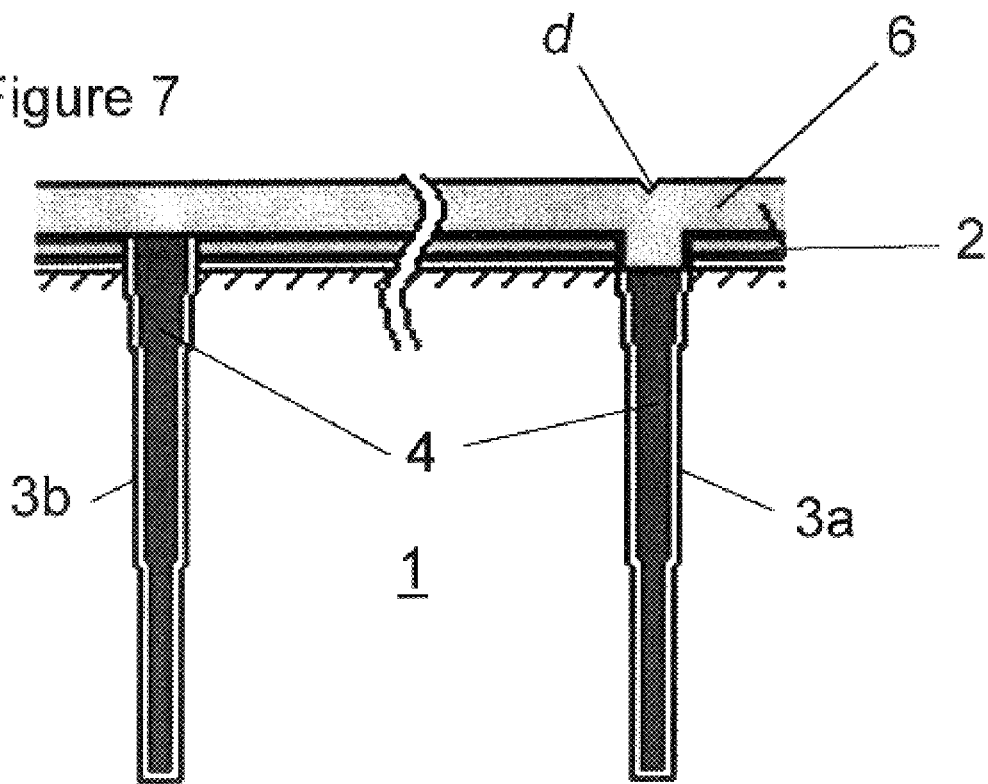
FIG. 7 shows the laying down of a silicon nitride layer.

Referring to FIG. 7, the exposed first set of trenches 3a are now plugged with a layer of, in our example, conformal silicon nitride 6. When choosing the plugging material, it is necessary to choose a material that is resistant to etching of the first fill material. It is also necessary that the material be resistant to the processing of the second fill material. Here, we simply use the same material as the original film 2, thereby rendering the plugged trenches "invisible" to the second fill (because presumably the original film 2 material was chosen to be resistant to the second material processing when the manufacturing process was planned). It is preferred that the silicon nitride layer 6 be thick enough to provide a substantially planer surface with minimal defects d, assuming one intends to polish down the layer with a reactive ion etch or equivalent. This can usually be achieved by depositing a layer no thinner than about half the width of the trench.

Figure 8:
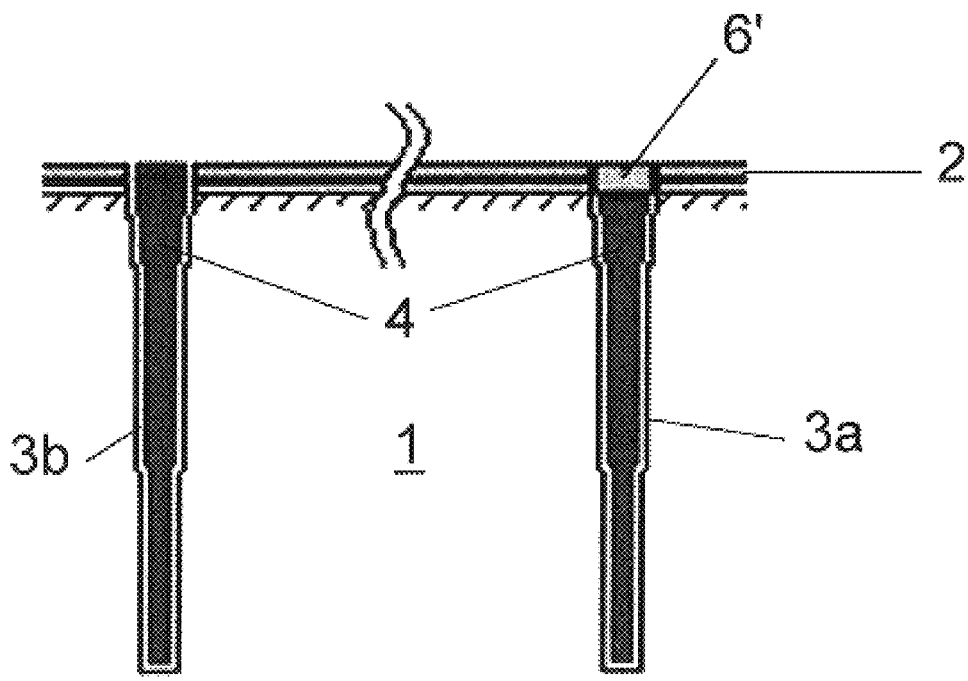
FIG. 8 shows the results of a reactive ion etch (RIE).

Referring to FIG. 8, the conformal silicon nitride layer 6 is etched in this example with a reactive ion etch down enough to expose the first fill 4 that remains in the second set of trenches 3b, but not down enough to remove a silicon nitride plug 6' from the first set of trenches 3a. Because reactive ion etch works almost entirely in the vertical direction, the topography of the silicon nitride layer 6 will be preserved, defects d and all. It is for this reason that it is desirable in to lay down this layer thick enough that it be substantially planar as explained above with regard to FIG. 7, so as to minimize the defects in the surface of the plug 6'.

Figure 9:
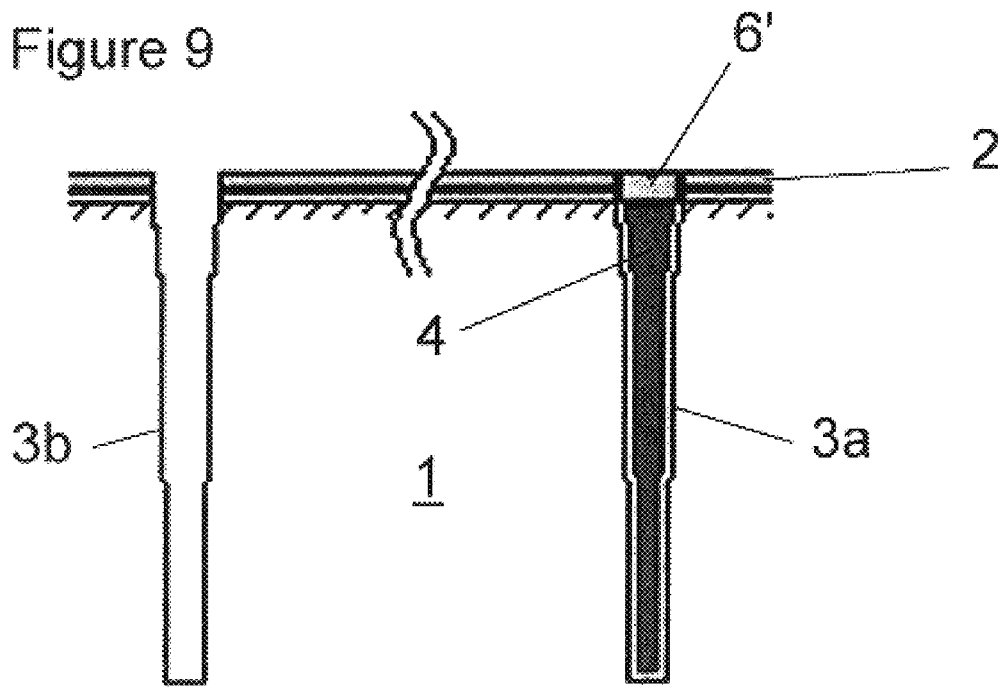
FIG. 9 shows the removal of first fill material from the second set of trenches.

Referring to FIG. 9, the first fill 4 is etched out of the second set of trenches 3b. While the plugged first set of trenches 3a remain undisturbed. A non-directional reactive ion etch may generally be preferred for this procedure.

Figure 10:
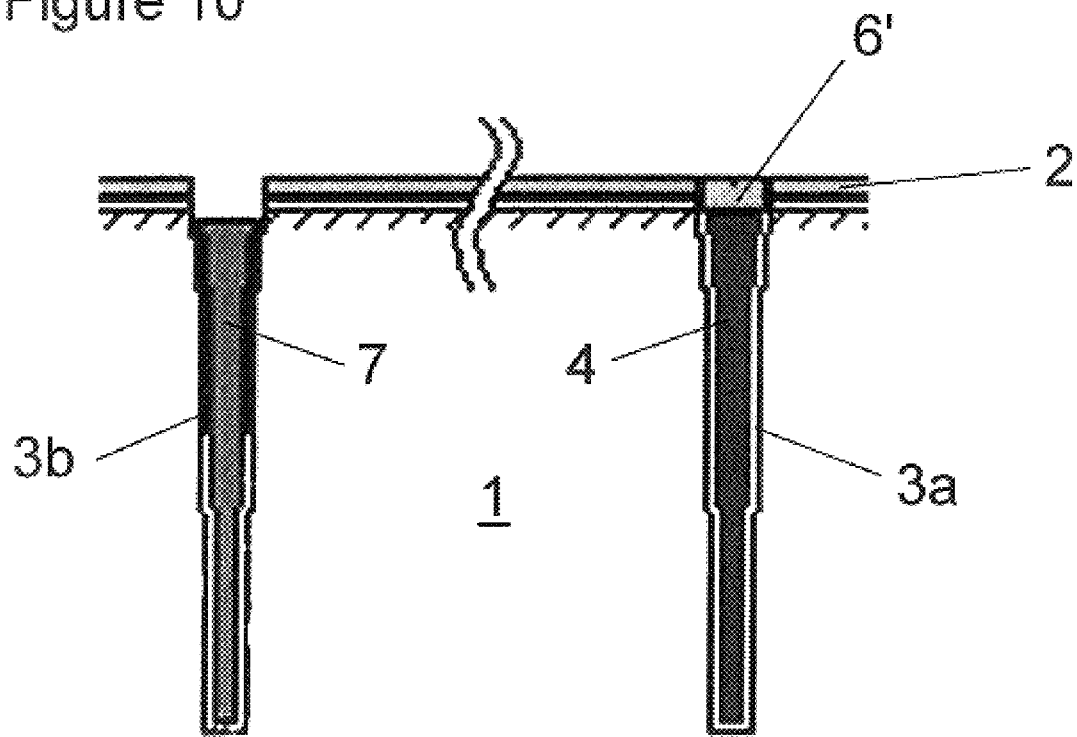
FIG. 10 shows the filling in of the second fill material in the second set of trenches.

Referring to FIG. 10, the second set of trenches 3b is filled with a second fill 7 as desired.

It should be noted that this process is not limited to two different materials, but may be generalized to any n number of fills for n sets of trenches, it being a straightforward matter to redesignate what is the "first and second" fills and "first and second" set of trenches after each recursion of the above-described process.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of providing variant fills in a semiconductor substrate having a plurality of trenches, said method comprising:

providing a semiconductor substrate with a first set of trenches and a second set of trenches;

filling all said trenches with a first fill material;

masking said second set of trenches in a manner effective in resisting an etching of said first fill material;

etching said first fill material in said first set of trenches to a depth effective in permitting said first set of trenches to be plugged, thereby defining a plug cavity in each of said first set of trenches;

plugging said plug cavities with a plugging material resistant to an etching of said first fill material;

etching said first fill material from said second set of trenches; and filling said second set of trenches with a second fill material.

2. The method of claim 1 wherein said semiconductor substrate has a silicon nitride film deposited thereon.

3. The method of claim 1 wherein said first fill material is conformal.

4. The method of claim 1 wherein said step of etching said first fill material in said first set of trenches for plugging further comprises etching said plug cavities in each of said first set of trenches to a depth no less than half the width of each of said first set of trenches.

5. The method of claim 1 wherein said step of etching said first fill material in said first set of trenches for plugging further comprises etching said plug cavities using a reactive ion etch.

6. The method of claim 1 wherein said plugging material is resistant to any subsequent processing performed on said second fill material.

7. The method of claim 4 wherein the step of plugging said plug cavities further comprises filling said plug cavities by laying down a layer of said plugging material on said semiconductor substrate to a height above said plug cavities that is no less than half the width of each of said first set of trenches.

8. The method of claim 4 wherein said plugging material is conformal.

9. The method of claim 1 wherein the step of plugging said plug cavities further comprises filling said plug cavities by laying down a layer of said plugging material on said semiconductor substrate to a height above said plug cavities that is no less than that which is effective in providing a substantially planer surface.

10. The method of claim 9 further comprising etching away said layer of plugging material with a reactive ion etch.

11. The method of claim 1 wherein said plugging material is silicon nitride.

12. The method of claim 1 wherein said etching of said first fill material from said second set of trenches is effected with a reactive ion etch.

13. The method of claim 12 wherein said reactive ion etch is a non-directional reactive ion etch.

* * * * *